United States Patent
Kurrer et al.

(12)

(10) Patent No.: US 6,291,765 B1
(45) Date of Patent: *Sep. 18, 2001

(54) ELECTROMAGNETICALLY SHIELDED HOUSING HAVING METAL PARTS SNAP-CONNECTED VIA A SPRING CONTACT STRIP

(75) Inventors: Siegfried Kurrer, Nürnberg; Werner Körber, Betzenstein; Ernst Billenstein, Burgbernheim; Kurt-Michael Schaffer, Eckental, all of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/152,309

(22) Filed: Sep. 14, 1998

Related U.S. Application Data

(63) Continuation of application No. PCT/DE97/00369, filed on Feb. 28, 1997.

(30) Foreign Application Priority Data

Mar. 12, 1999 (DE) .......................... 296 04 599 U

(51) Int. Cl.⁷ ..................................... H05K 9/00
(52) U.S. Cl. .................. 174/35 R; 174/35 GC; 174/35 MS; 361/415; 361/808; 361/818
(58) Field of Search ............... 174/35 R, 35 GC, 174/35 MS; 29/592.1; 361/415, 800, 818; 439/108, 607, 608, 609; 205/50

(56) References Cited

U.S. PATENT DOCUMENTS 5,029,254 * 7/1991 Stickney ................... 174/35 GC
5,233,507 * 7/1993 Gunther et al. ................... 361/818
5,250,751 * 10/1993 Yamaguchi ................... 174/35 GC

FOREIGN PATENT DOCUMENTS

| 3523770 | 1/1987 | (DE) . |
| 8714497 | 1/1988 | (DE) . |
| 3928461 | 3/1991 | (DE) . |
| 9209519 | 10/1992 | (DE) . |
| 9402714 | 5/1994 | (DE) . |
| 29618628 | 1/1997 | (DE) . |
| 29618631 | 1/1997 | (DE) . |

* cited by examiner

Primary Examiner—William A. Cuchlinski, Jr.
Assistant Examiner—Ronnie Mancho
(74) Attorney, Agent, or Firm—Sughrue, Mion, Zinn, Macpeak & Seas, PLLC

(57) ABSTRACT

An electromagnetically shielded housing, in particular a subrack, has metal housing parts and at least one spring contact strip (FE). The spring contact strip is joined to a first housing part (BE) and is shaped such that the first housing part simultaneously makes contact with and is snap-connected to a second housing part (QV). When the electromagnetically shielded housing is fashioned as a subrack, a subrack shielding plate corresponds to the first housing part and a transverse rail corresponds to the second housing part. The stress-free snap-connection of the subrack shielding plate and transverse rail provided by the spring contact strip requires no additional compression. It is not necessary to screw down the subrack shielding plate, unless, for example, increased stability is desired. It is particularly advantageous if a distal edge of the preferably angled-off edge region (KE) of the subrack shielding plate is recessed into the housing and does not bend back out from the transverse rail. This avoids having the edge region protrude from the housing and produces optimum electro-magnetic shielding.

19 Claims, 4 Drawing Sheets

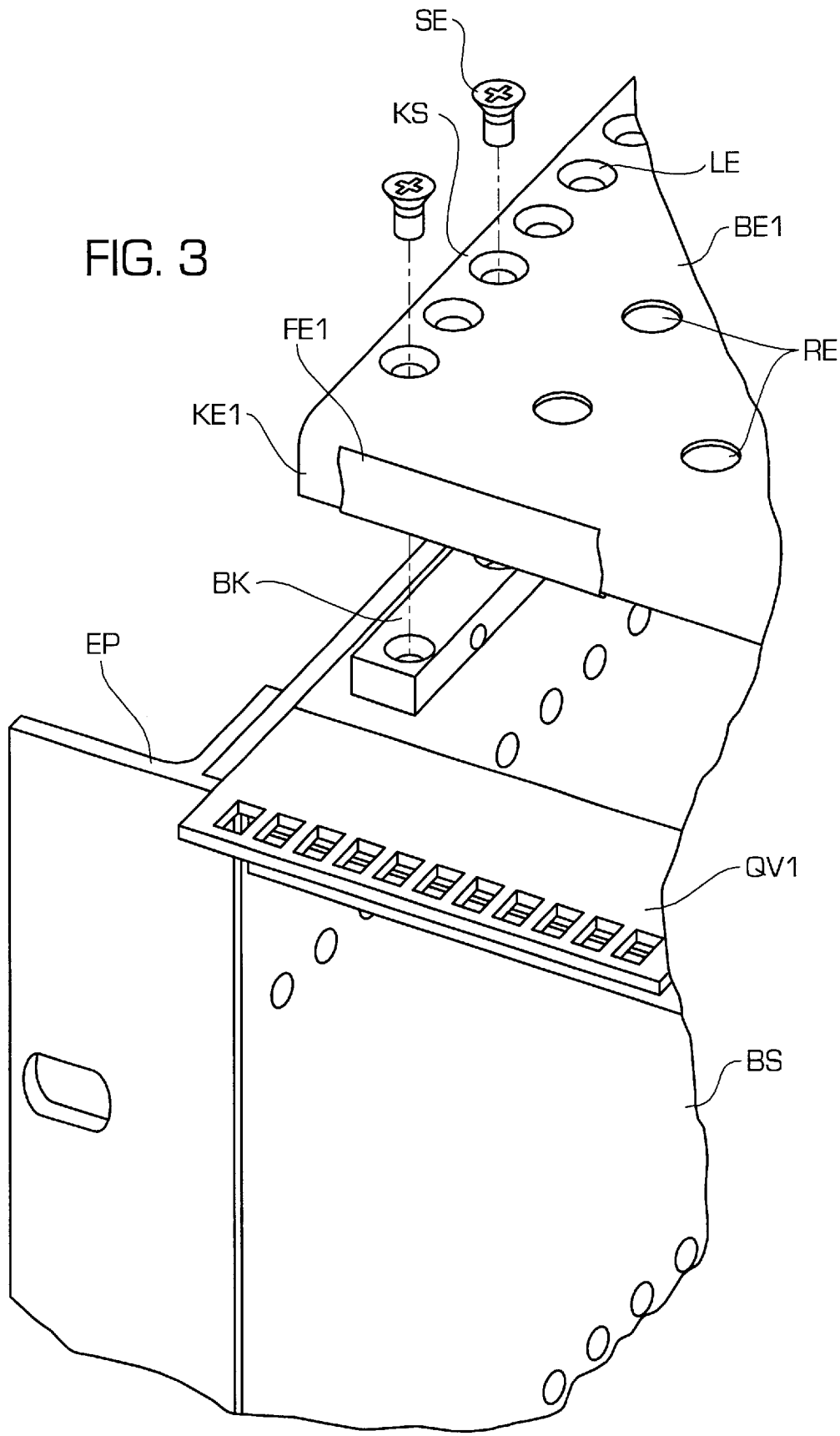

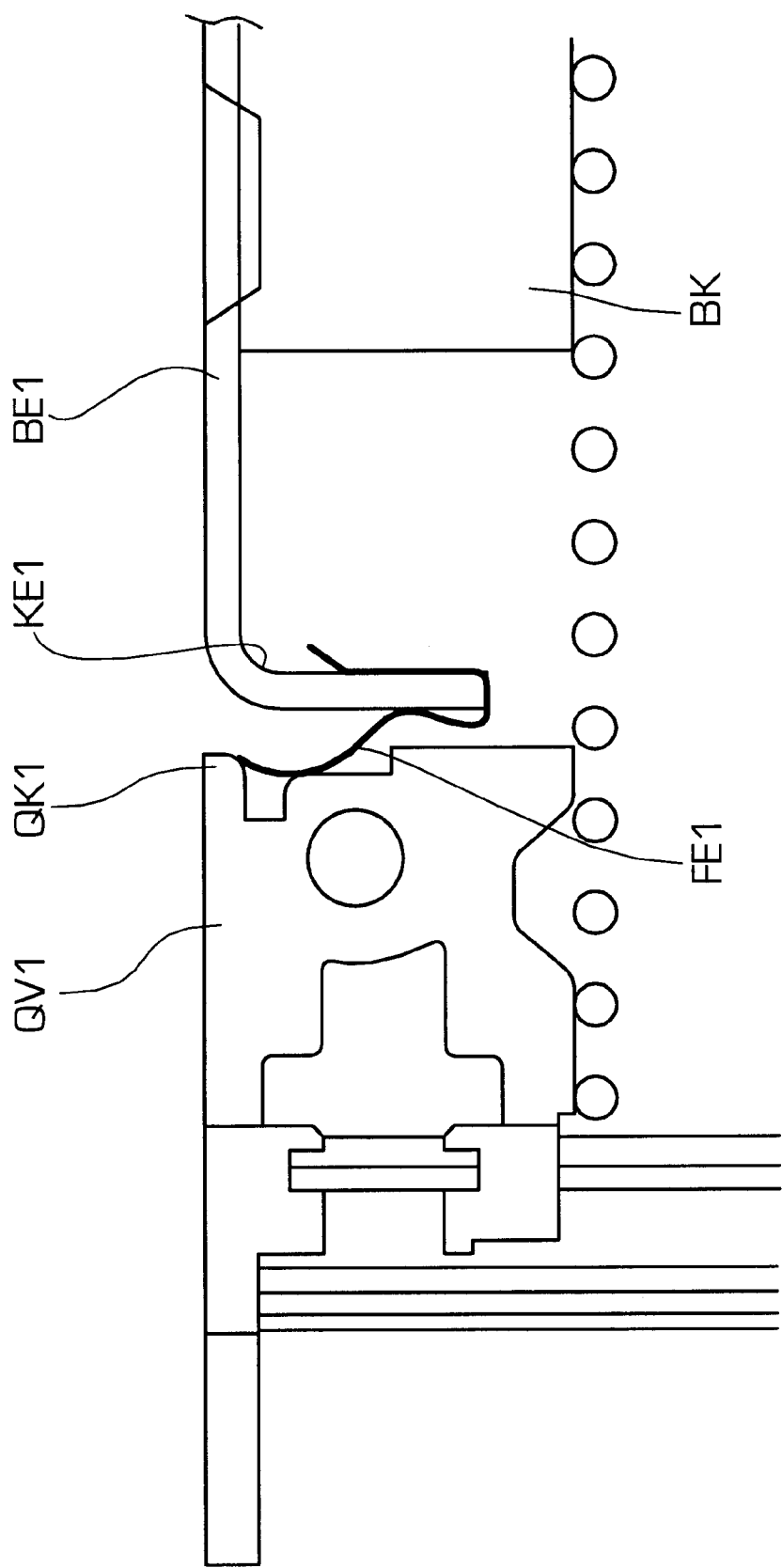

ELECTROMAGNETICALLY SHIELDED HOUSING HAVING METAL PARTS SNAP-CONNECTED VIA A SPRING CONTACT STRIP

This is a Continuation of International Application PCT/DE97/00369, with an international filing date of Feb. 28, 1997, the disclosure of which is incorporated into this application by reference.

FIELD OF AND BACKGROUND OF THE INVENTION

The invention relates to new and useful improvements in electomagnetically shielded housings for electric circuits. To ensure interference-free functioning of such circuits, the circuits must be shielded against electromagnetic waves. This means that the housing surrounding the electric circuit must comprise mostly metal parts. The shielding prevents electromagnetic waves from both entering and leaving the housing. This requires continuous electric connections, in particular contact spring elements, between the metal housing parts. These connections must have as few gaps as possible, in correspondence with the range of applicable electromagnetic frequencies.

German Utility Model G 92 09 519.4 discloses an RF-proof subrack having a cover with angled edge strips along the lateral edges of the cover. With the cover mounted, these edge strips engage in longitudinal grooves of two upper module rails of the subtrack. Inserted into each of the longitudinal grooves in this arrangement is a strip-shaped spring element. With the cover mounted and screwed against the upper module rails by means of fastening screws, this strip-shaped spring element produces an electric contact between the module rails and the cover.

A disadvantage is the use of separate elements for the electrical connection and mechanical connection between the module rails and cover, which complicates the mounting of the cover. Whereas the electrical connection is produced by the angled-off edge strips of the cover, which engage in the longitudinal grooves, the mechanical connection is provided by means of screws.

German Patent DE 39 28 461 C2 discloses an electromagnetically shielded subrack which has metal cover plates with edges that are angled off on all four sides. Profiled rails with grooves are fitted in the subrack and have a strip-shaped projection on one edge. V-springs are inserted into these grooves and extend along virtually the entire groove length. The angled-off edges of one cover plate, which extend in the width direction of the subrack, are pressed into the grooves during assembly. The angled-off edges press against the limbs of the springs and generate an electrical connection between the cover plate and profiled rails. The angled-off edges on the insides of the side walls rest on those ends of the cover plates which extend in the direction of the side walls. The side-walls can be screwed mechanically to the edges of the cover plates through holes drilled in the side walls at the level of the edges, and can be compressed to form an electrical connection.

A problem in assembling the subrack is caused by a counterpressure exerted by the V-springs on the angled-off edges of the cover plate. Thus, these edge regions of the cover plate bend upward, and must additionally be pressed onto the profiled rails for the purpose of assembly, causing extra work. It is therefore impossible to avoid subsequently screwing the cover plate to the side walls. Furthermore, despite screwing down the cover plate, it is impossible to prevent the angled-off edges from bending upward as result of the V-springs, in some cases causing the angled-off edges to project slightly. This can result in an undesirable permanent warping of the cover plate and an impairment of the electromagnetic shielding.

German Utility Model DE 94 02 714 U1, on the other hand, discloses a subrack having shaped strips and having top plates. The top plates are fastened via rivet joints and catch springs, whereby the catch springs latch on the shaped strips. For the purpose of electromagnetic sealing between the top plates and shaped strips, sealing elements in the form of foam plastic seals wrapped with metal foil are additionally fastened to the shaped strips.

A further subrack having module rails and having cover plates is described in German Utility Model DE 296 18 631 U1. In this case, a fastening groove, into which a spring element is inserted in a clamping fashion, is recessed in the module rails. An angled-off edge strip of the cover plate extends into the spring element. Contact is made with the cover plate via inwardly spread-out spring tongues of the spring elements.

OBJECTS OF THE INVENTION

It is therefore an object of the invention to provide an electromagnetically shielded housing, in particular a subrack, which permits simpler assembly of the metal housing parts. A further object of the invention is to provide a housing, in particular a subrack, exhibiting superior electromagnetic shielding.

SUMMARY OF THE INVENTION

These and other objects are achieved by means of an electromagnetically shielded housing, in particular a subrack, having metal parts and at least one spring contact strip, which is shaped and joined to a first metal housing part in such a way that the same can simultaneously make contact with and be snap-connected to a second metal housing part. The spring contact strip includes a constricted region, by which the contact strip is clamped to the first housing part, and a contact bow, which is shaped so that the contact bow latches the first housing part to the second housing part.

One advantage of the housing in accordance with the invention is the simplified assembly of the housing parts, for example the cover plates of a subrack. The snap connection of two housing parts effected by means of the spring contact strip requires no additional compression. Nor is there any need for the housing parts to be screwed together. If, on the other hand, a screwed joint is nevertheless desired, the screws can be introduced into the housing parts, which, in their final position, will be fixed without producing internal stresses.

It is particularly advantageous that, for example in the case of a subrack as an embodiment of the shielded housing, the distal edges of the cover plates are not bent back again from the spring groove of a transverse rail after being pressed in, but rather are firmly locked therein. This permits optimum electromagnetic shielding even in the transition region between the housing parts.

Further advantageous embodiments of the invention are specified the dependent claims.

BRIEF DESCRIPTION OF THE DRAWINGS

The invention and further advantageous refinements of the invention according to the features of the dependent claims are explained in more detail below with the aid of diagrammatic, exemplary embodiments, in which:

FIG. 3 is a perspective and partly exploded view of the front corner region of a subrack, in which a subrack shielding plate in accordance with the invention is shown ready to make contact with and be snap-connected to a front transverse rail of the subrack; and FIG. 4 is a cross-sectional view of the housing represented in FIG. 3, with a first housing part in accordance with the invention placed in contact with and snap-connected to a second housing part by means of a spring contact strip, and with the first housing part additionally supported in the region of the side edges by support elements.

DETAILED DESCRIPTION OF THE PREFERRED EMBODIMENTS

Figure 1:
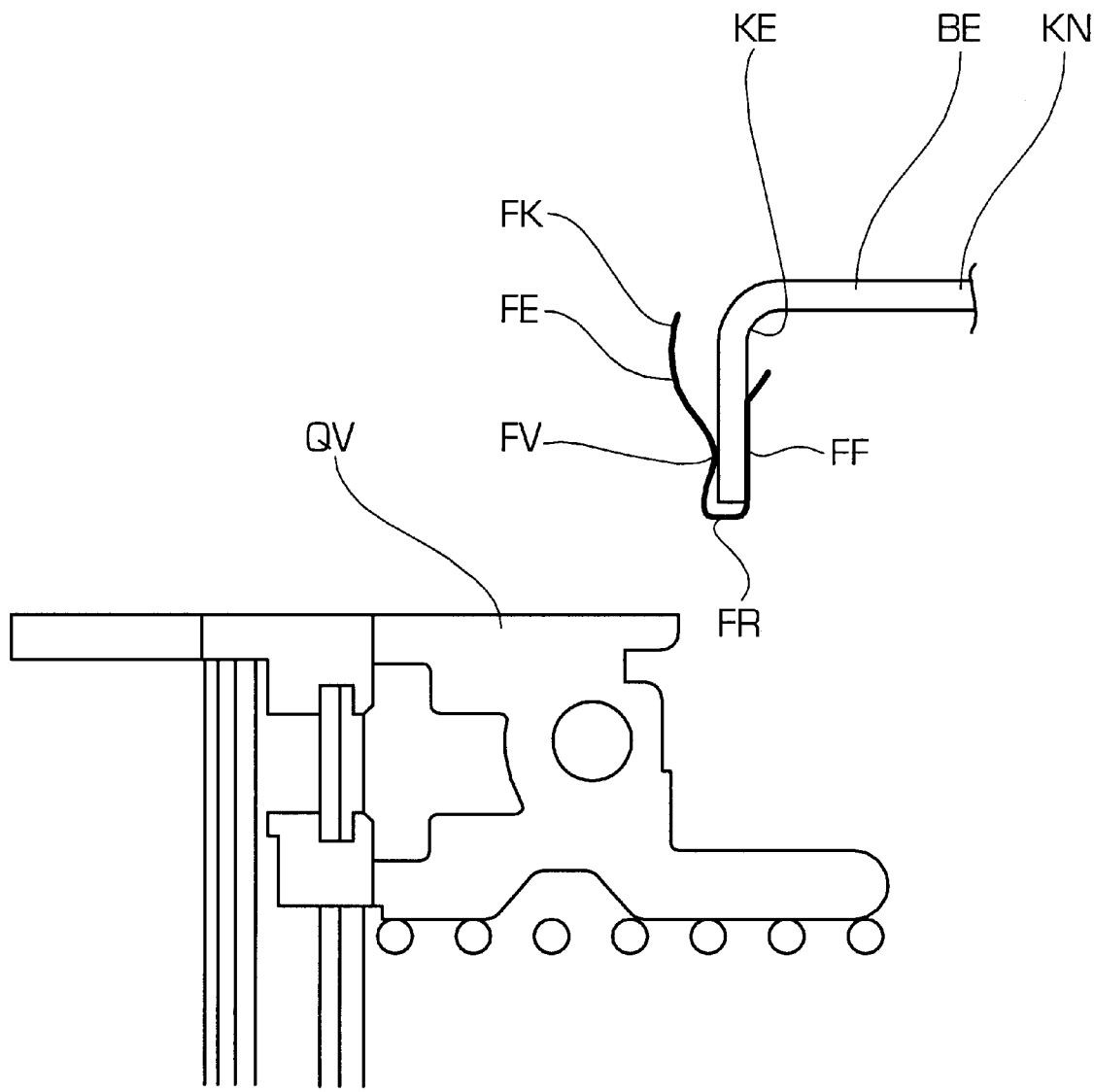
FIG. 1 shows, by way of example, a cross-section of a housing according to the invention and having a first housing part with a pushed-on spring contact strip, and a second housing part.

FIG. 1 represents, by way of example, a first metal housing part BE and a second metal housing part QV of an electromagnetically shielded housing in accordance with the invention. In the cross-sectional view shown, the first housing part BE is not yet mounted on the second housing part QV this represents the state before assembly of the two housing parts BE, QV. The first housing part BE is provided with at least one spring contact strip FE. The joint between the first housing part BE and the spring contact strip FE is based principally on a snap connection, i.e., a press-fit or clamp connection.

In one embodiment of the electromagnetically shielded housing according to the invention, the first housing part BE has a preferably angled-off edge region KE to which the spring contact strip FE is attached. This angled-off portion of the edge region KE represents a contact limb, in particular, and is produced, for example, by bending the edge of the first housing part BE at a location outside of a non-edge region KN. In the present case, the first housing part BE generally takes the form of a metal sheet.

In the electromagnetically screened housing according to the invention, the spring contact strip FE has a constricted region FV by means of which the spring contact strip FE is press-connected to the first housing part BE. The constricted region FV is configured in the base region of the spring contact strip FE such that the spring can be pressed onto the edge of the first housing part BE to form a connection.

Figure 2:
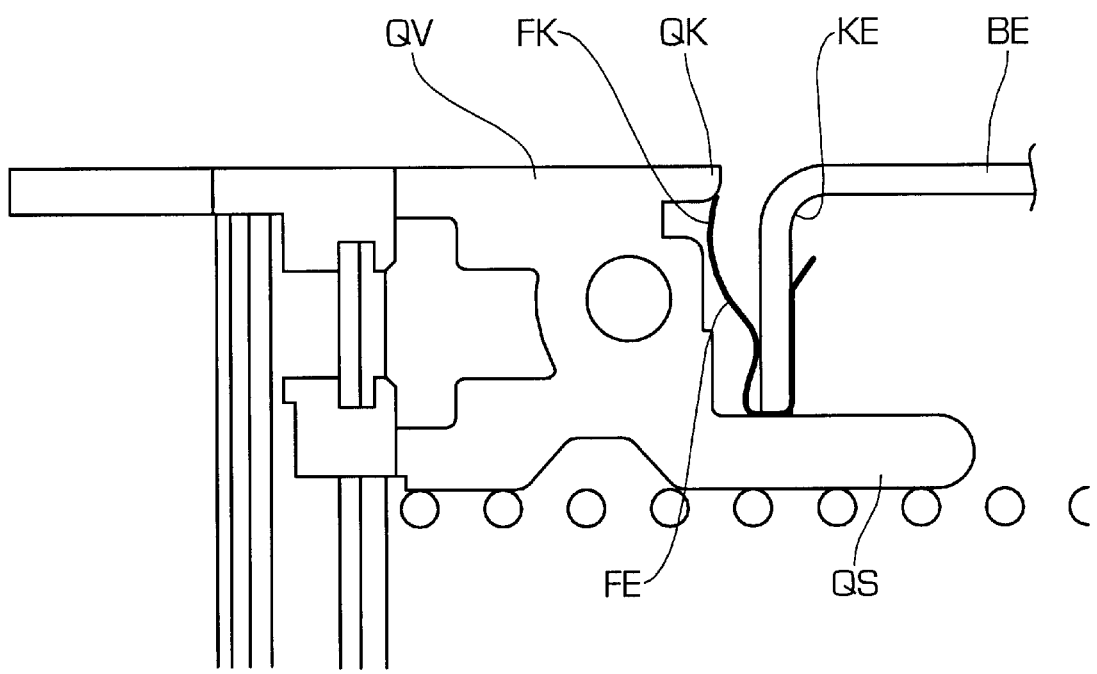
FIG. 2 shows et cross-section of the housing of FIG. 1, in which the first housing part makes contact with and is snap-connected to the second housing part by means of the pushed-on spring contact strip.

FIG. 2 represents the electromagnetically shielded housing of FIG. 1, again in cross-section but assembled. The first housing part BE simultaneously makes contact with and locks onto the second metal housing part QV via the spring contact strip FE. This design for the connection facilitates the assembly and prevents undesired separation of the housing parts. The spring contact strip FE produces an electrical connection between the first and the second housing parts BE and QV, thus shielding the housing electromagnetically.

In the electromagnetically shielded housing according to the embodiment of FIGS. 1 and 2, the spring contact strip FE has a contact bow FK which extends in such a way that it bears resiliently against the second housing part QV and makes contact with and is locked to the second housing part QV. In the embodiment of FIG. 2, the contact bow FK locks behind a preferably strip-shaped projection QK of the second housing part QV.

In addition to the contact bow FK and the constricted region FV, the spring contact strip FE includes a ridge portion FR and a flank portion FF. The ridge portion FR cradles the distal edge of the angled-off edge region KE of the first metal housing part BE. The flank portion FF extends up and rests against an inner surface of the angled-off edge region KE, such that the angled-off edge region KE is gripped between the constricted region FV and the flank portion FF.

A strip-shaped bearing limb QS of the second housing part QV can be used to support the first housing part BE in the region of the angled-off edge region KE.

In a further embodiment of the invention, illustrated in FIGS. 3 and 4, the electromagnetically shielded housing is designed as a subrack. A shielding plate BE1, in particular a subrack shielding plate such as a laminate screening plate, can be used as the first housing part, and a transverse rail QV1 as the second housing part. The width of the angled-off edge region KE1 of the subrack shielding plate BE1 is then matched to the transverse rail QV1 to which the angled-off edge region KE1 locks by means of the spring contact strip FE1.

FIG. 3 Shows the front corner region of such a subrack. The subrack has at least one upper metal subrack shielding plate BE1 having an angled-off edge region KE1 and at least one metal front transverse rail QV1. The spring contact strip FE1 pressed onto the subrack shielding plate BE1 is represented in partial cutaway in the exemplary, perspective representation of FIG. 3. The subrack shielding plate BE1 is not yet located in the position where it is locked with the front transverse rail QV1.

The exemplary embodiment in FIG. 3 additionally includes a separate, inwardly situated supporting element BK. This supporting element BK, or a plurality of them, joins the subrack shielding plate BE1 and the side panel sheet BS in the edge region thereof, which resembles a corner joint. This further ensures electromagnetic shielding in the interior of the subrack with a minimum of gaps. The side edge KS of the subrack shielding plate BE1 that rests on the supporting element or elements BK, unlike the angled-off edge region KE1, is preferably not angled off. Thus, no overlapping occurs between the subrack shielding plate BE1 and the side panel sheet BS in this joint. The corresponding side edges thereof now abut one another as a corner joint and can be joined to one or more supporting elements BK. Among other benefits, this provides variability with respect to the positioning of supporting elements BK, in particular in the edge region. The supporting element or elements BK can also be used for further corner joints in the subrack, for example between a possible further, lower subrack shielding plate and further side panel sheets or front and/or rear panels. A screw connection by means of countersunk screws SE has proved to be advantageous for joining the subrack shielding plate BE1, the side panel sheet BS and the supporting element BK.

In the exemplary embodiment of FIG. 3, the subrack has a lateral corner shape EP which is joined to a side panel sheet BS of the subrack and, at least in the upper corner region, to a front transverse rail QV1. The subrack shielding plate BE1 has an array of ventilation holes RE for ventilation of modules inserted into the subrack. For symmetry, the subrack can have a lower subrack shielding plate BE1, not represented in FIG. 3, further transverse rails QV1 and a further side panel sheet BS or front and/or rear panels. For the purpose of screwing the elements together by means of countersunk screws SE, the subrack shielding plate BE1 has a row of fastening holes LE, at least in the side region of the edge or edges which are situated closest to the side panel sheet or sheets BS.

FIG. 4 represents a cross-section of the corner region of the subrack illustrated in FIG. 3. A first housing part BE1 makes contact with and is snap-connected to a second housing part QV1. A spring contact strip FE1 which is joined to the angled-off edge region KE1 of the first housing part BE1 locks behind a strip-shaped projection QK1 of the second housing part QV1. The first housing part BE1 is supported in the region of those side edges that are not angled off, on supporting elements BK.

The invention is particularly advantageous as an electromagnetically shielded housing for subracks. The simplified assembly of the subrack shielding plates BE1 is particularly advantageous. The stress-free snap connection provided by the spring contact strip FE1 between the subrack shielding plate BE1 and the transverse rail QV1 requires no additional fixing or compression. Additional screwing of the subrack shielding plate BE1 to the side panel sheets BS need be performed only if increased stability is required. This can be done, for example, by screwing together the elements by means of advantageous supporting elements BK or by means of further bends, not represented in FIG. 3, of the lateral edge region of the subrack shielding plate BE1. The superior electromagnetic shielding resulting from the snap connection in the transition region between the subrack shielding plates BE1 and the transverse rails QV1 is particularly advantageous.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications embraced by the spirit and scope of the invention, as defined by the appended claims, and equivalents thereof.

What is claimed is:

1. An electromagnetically shielded housing comprising:
   first and second metal housing parts, said second housing part being a transverse rail and comprising a projection; and
   at least one spring contact strip extending in a longitudinal direction, said contact strip comprising:
      at least one constricted region via which said contact strip is clamped to said first housing part, and
      at least one contact bow that extends from said constricted region in a lateral direction and contacts said projection, to latch said first housing part to said second housing part, and that provides electromagnetic contact between said first housing part and said second metal housing part.

2. The housing as claimed in claim 1, wherein said first and second housing parts are components of a subrack.

3. The housing as claimed in claim 1, wherein:
   said first housing part comprises an edge region; and
   said spring contact strip is clamped to said edge region of said first housing part.

4. The housing as claimed in claim 3, wherein:
   said first housing part further comprises a non-edge region;
   said edge region comprises an angled-off portion extending at an angle to said non-edge region; and
   said spring contact strip is clamped to said angled-off portion of said first housing part.

5. The housing as claimed in claim 1, wherein:
   said projection extends as a continuous band in the longitudinal direction along an entire length of said second housing part.

6. The housing as claimed in claim 1, wherein said first housing part is a screening plate.

7. The housing as claimed in claim 4,
   further comprising at least one supporting element situated inside said housing; and
   wherein said first housing part further comprises at least one side edge which is not angled off from said non-edge region and which is supported by said supporting element.

8. The housing as claimed in claim 7, wherein:
   said second housing part comprises a sidewall; and
   said supporting element is affixed to said sidewall.

9. The housing as claimed in claim 1, wherein:
   said constricted region and said contact bow are both formed from a single, unitary metal piece of said spring contact strip; and
   said contact bow extends from said constricted region in a direction generally away from said housing.

10. The housing as claimed in claim 1, wherein said spring contact strip is formed from a single, unitary piece of metal.

11. The housing as claimed in claim 3, wherein said spring contact strip extends essentially along an entire length of said edge region of said first housing part.

12. The housing as claimed in claim 3, wherein said spring contact strip further comprises a flank portion and a ridge portion.

13. The housing as claimed in claim 12, wherein:
   said ridge portion extends from said constricted region and said flank portion extends from said ridge portion;
   said edge region of said first housing part is clamped between said constricted region and said flank portion; and
   a distal edge of said edge region of said first housing part is cupped by said ridge portion.

14. The housing as claimed in claim 12, wherein:
   said constricted region extends from said ridge portion in the lateral direction; and
   said flank portion extends from said ridge portion in the lateral direction.

15. An electromagnetically shielded housing comprising:
   first and second metal housing parts; and
   at least one spring contact strip, said contact strip comprising:
      a ridge portion and a flank portion;
      a constricted region; and
      a contact bow that latches said first housing part to said second housing part and provides electromagnetic contact between said first housing part and said second metal housing part;
   wherein said second housing part is a transverse rail;
   wherein said constricted region separates said ridge portion and said contact bow along an entire length of said spring contact strip; and
   wherein at least said flank portion and said constricted region, but no portion of said contact bow, clamp said contact strip to said first housing part.

16. The housing as claimed in claim 15, wherein:
   said second housing part comprises a projection; and
   a distal end of said contact bow rests fully recessed behind said projection when said first housing part is latched to said second housing part.

17. An electromagnetically shielded subrack housing comprising:
- a transverse rail;
- a subrack shielding plate; and
- at least one spring contact strip extending along said transverse rail and said subrack shielding plate, said contact strip comprising:
  - a constricted region clamping said contact strip to said subrack shielding plate, and
  - a contact bow extending from said constricted region in a direction lateral to said transverse rail, latching said subrack shielding plate to said transverse rail, and providing electromagnetic contact between said subrack shielding plate and said transverse rail.

18. The subrack housing according to claim 17, wherein:
- said transverse rail comprises a projection extending along said transverse rail in a longitudinal direction; and
- said contact bow terminates laterally behind said projection, snap-connecting said subrack shielding plate to said transverse rail.

19. The housing as claimed in claim 1, wherein said contact bow locks behind said projection.

* * * * *